United States Patent
Weller et al.

(10) Patent No.: US 9,594,141 B2
(45) Date of Patent: Mar. 14, 2017

(54) SYSTEM FOR ACCELERATED MAGNETIC RESONANCE IMAGING USING PARALLEL COILS

(71) Applicants: Daniel Weller, Ann Arbor, MI (US); Leo Grady, Millbrae, CA (US); Lawrence Wald, Cambridge, MA (US); Vivek K Goyal, Cambridge, MA (US)

(72) Inventors: Daniel Weller, Ann Arbor, MI (US); Leo Grady, Millbrae, CA (US); Lawrence Wald, Cambridge, MA (US); Vivek K Goyal, Cambridge, MA (US)

(73) Assignees: National Institutes of Health (NIH), U.S. Dept. of Health and Human Services (DHHS), The United States of America NIH Division of Extramural Inventions and Technology Resources (DEITR), Washington, DC (US); The General Hospital Corporation, Boston, MA (US); Siemens Healthcare GmbH, Erlangen (DE)

(*) Notice: Subject to any disclaimer, the term of this patent is extended or adjusted under 35 U.S.C. 154(b) by 1169 days.

(21) Appl. No.: 13/633,908

(22) Filed: Oct. 3, 2012

(65) Prior Publication Data
US 2013/0207652 A1  Aug. 15, 2013

Related U.S. Application Data

(60) Provisional application No. 61/599,201, filed on Feb. 15, 2012.

(51) Int. Cl.
| G01R 33/341 | (2006.01) |
| G01R 33/58 | (2006.01) |
| G01R 33/561 | (2006.01) |

(52) U.S. Cl.
CPC ............. *G01R 33/5611* (2013.01)

(58) Field of Classification Search
CPC ............................ G01R 33/5611
(Continued)

(56) References Cited

U.S. PATENT DOCUMENTS

| 2010/0308824 A1* | 12/2010 | Grady ............ G01R 33/5611 324/309 |
| 2012/0081114 A1* | 4/2012 | Weller ........... G01R 33/5611 324/309 |
| 2012/0092009 A1 | 4/2012 | Zhang et al. |

OTHER PUBLICATIONS

D. S. Weller, J. R. Polimeni, L. Grady, L. L. Wald, E. Adalsteinsson, and V. K Goyal. "Accelerated Parallel Magnetic Resonance Imaging Reconstruction Using Joint Estimation with a Sparse Signal Model." In Proc. 2012 IEEE Statist. Signal Process. Workshop. Ann Arbor, USA, Aug. 2012, pp. 221-224.
(Continued)

*Primary Examiner* — Melissa Koval
*Assistant Examiner* — Rishi Patel

(57) ABSTRACT

An MR imaging system uses multiple RF coils for acquiring corresponding multiple image data sets of a slice or volume of patient anatomy. An image data processor comprises at least one processing device conditioned for, deriving a first set of weights for weighted combination of k-space data of the multiple image data sets for generating a calibration data set comprising a subset of k-space data of composite image data representing the multiple image data sets. The image data processor uses the calibration data set in generating a first MR image data set, deriving the parameters of a probability distribution in response to the first set of weights and the first MR image data set and deriving a second set of weights and second MR image data set together using the probability distribution.

21 Claims, 5 Drawing Sheets

(58) Field of Classification Search
USPC ........ 324/307, 309, 314, 318, 322; 382/131; 600/410
See application file for complete search history.

(56) References Cited

OTHER PUBLICATIONS

M. Lustig, D. Donoho, and J. M. Pauly, "Sparse MRI: The application of compressed sensing for rapid MR imaging," Magn. Reson. Med., vol. 58, No. 6, pp. 1182-1195, Dec. 2007.
K. P. Pruessmann, M. Weiger, M. B. Scheidegger, and P. Boesiger, "SENSE: sensitivity encoding for fast MRI," Magn. Reson. Med., vol. 42, No. 5, pp. 952-962, Nov. 1999.
M. A. Griswold, P. M. Jakob, R. M. Heidemann, M. Nittka, V. JeHus, J. Wang, B. Kiefer, and A. Haase, "Generalized autocalibrating partially parallel acquisitions (GRAPPA)," Magn. Reson. Med., vol. 47, No. 6, pp. 1202-1210, Jun. 2002.
M. Lustig and J. M. Pauly, "SPIRiT: Iterative self-consistent parallel imaging reconstruction from arbitrary k-space," Magn. Reson. Med., vol. 64, No. 2, pp. 457-471, Aug. 2010.
D. Liang, B. Liu, J. Wang, and L. Ying, "Accelerating SENSE using compressed sensing," Magn. Reson. Med., vol. 62, No. 6, pp. 1574-1584, Dec. 2009.
M. Lustig, M. Alley, S. Vasanawala, D. L. Donoho, and J. M. Pauly, "L1 SPIR-iT: Autocalibrating parallel imaging compressed sensing," in Proc. ISMRM 17th Scientific Meeting, Apr. 2009, p. 379.
D. S. Weller, 1. R. Polimeni, L. Grady, L. L. Wald, E. Adalsteinsson, and V. K Goyal, "Denoising sparse images from GRAPPA using the nullspace method (DESIGN)," Magn. Reson. Med., to appear.
D. S. Weller, J. R. Polimeni, L. Grady, L. L. Wald, E. Adalsteinsson, and V. K Goyal, "Regularizing grappa using simultaneous sparsity to recover de-noised images," in Proc. SPIE Wavelets and Sparsity XIV, Aug. 2011, vol. 8138, pp. 81381M-I-9.
D. S. Weller, J. R. Polimeni, L. Grady, L. L. Wald, E. Adalsteinsson, and V. K Goyal, "Evaluating sparsity penalty functions for combined compressed sensing and parallel MRI," in Proc. IEEE Int. Symp. on Biomedical Imaging, Mar.-Apr. 2011, pp. 1589-1592.
S.F. Cotter, B.D. Rao, K. Engan, and K. Kreutz-Delgado, "Sparse solutions to linear inverse problems with multiple measurement vectors," IEEE Trans. Signal Process., vol. 53, No. 7, pp. 2477-2488, Jul. 2005.
P. W. Holland and R. E. Welsch, "Robust regression using iteratively re-weighted least-squares," Commun. Statist. A: Theory Meth., vol. 6, No. 9, pp. 813-827, 1977.
D. C.-L. Fong and M. A. Saunders, "LSMR: An iterative algorithm for sparse least-squares problems," SIAMJ Sci. Comput., vol. 33, No. 5, pp. 2950-2971, 2011.
U.S. Appl. No. 13/615,785, filed Sep. 14, 2012.
P.B. Roemer, et al., "The NMR Phased Array", Magnetic Resonance in Medicine 16, 192-225 (1990).
Klaas P. Pruessmann, et al., "SENSE: Sensitivity Encoding for Fast MRI", Magnetic Resonance in Medicine 42:952-962 (1999).
Mark A Griswold, et al., "Generalized Autocalibrating Partially Parallel Acquisitions (GRAPPA)", Magnetic Resonance in Medicine 47:1202-1210 (2002).
Daniel K. Sodickson, et al, "Simultaneous Acquisition of Spatial Harmonics (SMASH): Fast Imaging with Radiofrequency Coil Arrays", MRM 38:591-603 (1997).
Fa-Hsuan Lin, et al., "Parallel Imaging Reconstruction Using Automatic Regularization", Magnetic Resonance in Medicine 51:559-567 (2004).
Mark Bydder, et al., "A nonlinear regularization strategy for GRAPPA calibration", Magnetic Resonance Imaging 27 (2009) 137-141.
Peter M. Jakob, et al., "AUTO-SMASH: A self-calibrating technique for SMASH imaging", Magnetic Resonance Materials in Physics. Biology and Medicine 7 (1998) 42-54.
Anja C.S. Brau, et al., "Comparison of Reconstruction Accuracy and Efficiency Among Autocalibrating Data-Driven Parallel Imaging Methods", Magnetic Resonance in Medicine 59:382-395 (2008).
Michael Lustig, et al., "Sparse MRI: The Application of Compressed Sensing for Rapid MR Imaging", Magnetic Resonance in Medicine 58:1182-1195 (2007).
Robert Tibshirani, "Regression Shrinkage and Selection via the Lasso", Journal of the Royal Statistical Society, Series B (Methodological), vol. 58, issue 1 (1996), 267-288.
Daniel S. Weller, et al., "Evaluating Sparsity Penalty Functions for Combined Compressed Sensing and Parallel MRI", Biomedical Imaging: From Nano to Macro, 2011 IEEE International Symposium on , vol., No., pp. 1589-1592, Mar. 30, 2011-Apr. 2, 2011.
D. S. Weller, et al., "SpRING: Sparse Reconstruction of Images using the Nullspace method and GRAPPA", Proc. Intl. Soc. Mag. Reson. Med. 19 (2011).
Zhang T, Lustig M, Vasanawala S, and Pauly JM. "I1-denoised Autocalibrating Parallel Imaging." Proc. ISMRM 18th Scientific Meeting. Stockholm, Sweden, May 2010, p. 4883.
M.A. Bernstein, et al., Handbook of MRI Pulse Sequences, book review, NMR In Biomedicine, NMR Biomed. 2005; 18:202-203.

\* cited by examiner

DWT image log |k-space|

Bayesian estimation
PSNR = 28.6 dB

GRAPPA
PSNR = 20.3 dB

SYSTEM FOR ACCELERATED MAGNETIC RESONANCE IMAGING USING PARALLEL COILS

This invention was made with government support under Grant No. R01 EB007942 awarded by the National Institutes of Health and under Grant No. CCF0643836 awarded by the National Science Foundation. The government has certain rights in the invention.

This is a non-provisional application of provisional application Ser. No. 61/599,201 filed 15 Feb. 2012, by Daniel Weller et al.

FIELD OF THE INVENTION

This invention concerns a system for parallel image acquisition and processing in MR imaging by deriving weights using a probability distribution for weighted combination of k-space data and of combining image data sets from different RF coils for generating a calibration data set and composite MR image data set.

BACKGROUND OF THE INVENTION

In known magnetic resonance imaging (MRI), image data is commonly acquired by raster scanning a spatial Fourier transform domain called k-space, thereby sampling k-space lines, and taking an inverse Fourier transform of the samples. MR imaging is limited by the time required to trace the k-space scan lines. However, accelerating MRI by reducing the number of k-space lines acquired is accompanied by reductions in image quality; accelerated parallel RF coil MRI undersamples k-space, using fewer lines spaced farther apart, reducing the field of view (FOV). This introduces aliasing when the object is larger than the reduced FOV, however the use of parallel RF coil imaging and parallel receivers resolves this aliasing and produces a full-FOV image from accelerated acquisitions.

Compressed sensing (CS) uses the compressibility of MR images to reconstruct images from randomly undersampled data. Methods like SENSE (SENSitivity Encoding), GRAPPA (Generalized autocalibrating partially parallel acquisitions), and SPIRiT (Compressed Sensing Parallel Imaging MRI) also are effective for reconstructing images from undersampled data, but these methods are affected by noise amplification or residual aliasing at high levels of acceleration. The combination of SENSE or SPIRiT with CS addresses the shortcomings of accelerated parallel imaging and achieves acceleration beyond what is achievable with either approach individually. The combination of GRAPPA with a sparsity model is more complicated due to characteristics of GRAPPA including the presence of a calibration step, the use of uniformly-spaced (nonrandom) undersampling, and the reconstruction of multiple channel images rather than a single combined image. A system according to invention principles addresses these deficiencies and related problems.

SUMMARY OF THE INVENTION

A system accelerates magnetic resonance imaging (MRI) by reducing the number of acquired k-space scan lines using a probability distribution method for jointly calibrating a (GRAPPA) reconstruction kernel and reconstructing full k-space from undersampled parallel MRI data. A system for parallel image processing in MR imaging includes multiple MR imaging RF coils for individually receiving MR imaging data representing a slice or volume of patient anatomy. An MR imaging system uses the multiple RF coils for acquiring the corresponding multiple image data sets of the slice. An image data processor comprises at least one processing device conditioned for, deriving a first set of weights for weighted combination of k-space data of the multiple image data sets for generating a calibration data set comprising a subset of k-space data of composite image data representing the multiple image data sets. The image data processor uses the calibration data set in generating a first MR image data set, deriving a probability distribution in response to the first set of weights and the first MR image data set and deriving a second set of weights and second MR image data set together using the probability distribution.

DETAILED DESCRIPTION OF THE INVENTION

A system employs a Bayesian interpretation of a reconstruction problem and a joint estimator that unifies a kernel calibration with full k-space reconstruction and denoising using a single solution. The system improves reconstruction quality at high levels of acceleration, accommodating both greater spacing between k-space samples and fewer auto-calibration (ACS) lines. The acceleration of magnetic resonance imaging (MRI) by reducing the number of acquired k-space scan lines benefits conventional MR imaging significantly by decreasing the time subjects remain in the scanner and can limit image artifacts caused by patient movement during the acquisition. The system advantageously employs a Bayesian estimation method for jointly calibrating a GRAPPA reconstruction kernel and reconstructing full k-space from undersampled parallel MRI data. The system employs a joint sparsity signal model for processing coil image data in conjunction with observation models for both the acquired data and GRAPPA reconstructed k-space. The system improves GRAPPA reconstruction at high levels of undersampling, increasing peak-signal-to-noise ratio by up to 10 dB, for example.

Figure 1:
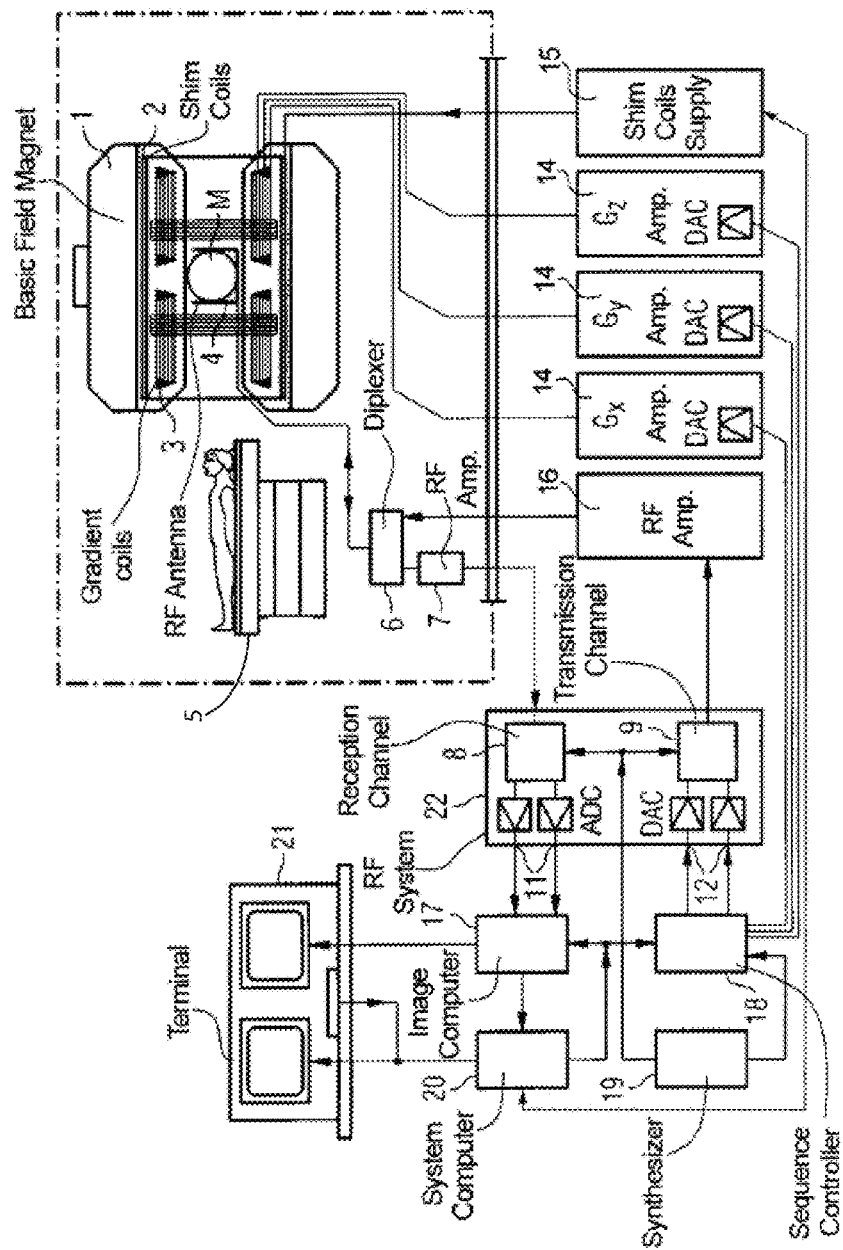
FIG. 1 shows a system for parallel image processing in MR imaging, according to invention principles.

FIG. 1 shows system 10 for parallel image processing in MR imaging. A basic field magnet 1 generates a strong magnetic field, which is constant in time, for the polarization or alignment of the nuclear spins in the examination region of an object, such as, for example, a part of a human body to be examined on automated movable patient support table 5. The automated patient support table 5 is controlled by system computer 20. The high homogeneity of the basic magnetic field required for the magnetic resonance measurement is provided in a spherical measurement volume M, for example, into which the parts of the human body to be examined are brought. In order to satisfy the homogeneity requirements and especially for the elimination of time-invariant influences, shim-plates made of ferromagnetic material are mounted at suitable positions. Time-variable influences are eliminated by shim coils 2, which are controlled by a shim-current supply 15.

Imaging computer 17 reconstructs an image from processed acquired RF echo pulse data. The processing of RF data, the image data and the control programs is performed under control of system computer 20. In response to predetermined pulse sequence control programs, sequence controller 18 controls generation of desired pulse sequences and corresponding scanning of k-space. In particular, sequence controller 18 controls the switching of the magnetic gradients at appropriate times, transmission of RF pulses with a determined phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens.

A system for parallel image processing in MR imaging system 10 includes multiple MR imaging RF coils 4 for individually receiving MR imaging data representing a slice of patient anatomy. MR imaging system 10 uses multiple RF coils 4 for acquiring corresponding multiple image data sets of the slice. In one embodiment, RF coils 4 comprise a subset or substantially all of, multiple RF coils arranged in sections along the length of volume M corresponding to the length of a patient. Further, an individual section RF coil of coils 4 comprises multiple RF coils providing RF image data that is used in parallel to generate a single MR image. Multiple RF coils 4 acquire corresponding multiple image data sets of a patient anatomical slice. An image data processor in imaging computer 17 comprises at least one processing device. The at least one processing device is conditioned for, deriving a first set of weights for weighted combination of k-space data of the multiple image data sets for generating a calibration data set comprising a subset of k-space data of composite image data representing the multiple image data sets. The at least one processing device uses the calibration data set in, generating a first MR image data set, deriving a probability distribution in response to the first set of weights and the first MR image data set and deriving a second set of weights and second MR image data set together using the probability distribution.

An estimation for each of the P coil channels of RF coils 4 uses N×P matrix Y, having columns represent the full k-space. Each of the coil images is assumed to be approximately sparse in a transform domain with analysis (forward) transform $\Psi$. In one embodiment, the system employs $W=\Psi F^{-1}Y$, where F is the discrete Fourier transform and imposes a sparsity model on W corresponding to the $l_{p,q}$ mixed norm, parameterized by $\lambda>0$, which controls the level of sparsity:

$$p(W) \propto e^{-\lambda \|W\|_{p,q}^p} = \prod_{n=0}^{N-1} e^{-\lambda \|[W_1[n], \ldots, W_P[n]]\|_q^p}. \tag{1}$$

To maintain convexity, p=1 is selected (½<p<1 may alternatively be imposed). Setting q=1 favors channel-by-channel sparsity, where the support of each transformed channel image is considered independently of those of the other channel images. For joint sparsity, where the supports of each transformed channel are assumed to overlap sufficiently and assuming RF coils 4 channels share the same support, the system uses q=2 (loose joint sparsity) or q=∞ (strict joint sparsity) to tie these channels together. Loose joint sparsity is assumed with q=2. Assuming W is complex, $$p(W) = \prod_{n=0}^{N-1} \frac{P! \lambda^{2P}}{(2P)! \pi^P} e^{-\lambda \|[W_1[n], \ldots, W_P[n]]\|_2}. \tag{2}$$

In accelerated MRI, a full k-space may be subdivided into $Y_a=K_aY$, the acquired k-space, and $Y_{na}=K_{na}Y$, the un-acquired k-space. In an acquisition, direct observations are acquired comprising k-space $D_a$, and based on a large number of individual proton spins, observation noise is modeled as complex Gaussian (with real and imaginary parts uncorrelated). As the noise is typically assumed to be random perturbations due to thermal and other uncorrelated variations, this noise is across k-space frequency measurements and correlates across channels for the same frequencies. Formally, $$p(D_a|Y)=CN(vec(D_a);vec(K_aY),I_{M\times M}\otimes \Lambda), \tag{3}$$

where $CN(\cdot;\mu,\Lambda)$ is the density function of the complex Normal distribution with mean $\mu$ and covariance $\Lambda$, $vec(\cdot)$ stacks the columns of a matrix into one vector, and $\otimes$ is the Kronecker product.

Additionally, the GRAPPA reconstruction method provides observations of the un-acquired data. Given the appropriate GRAPPA kernel G, the GRAPPA reconstruction yields $Y_{na}=GRAPPA(G,Y_a)$. Since GRAPPA is linear in $Y_a$, substituting $D_a$ yields $Y_{na}$+amplified noise. Calling these GRAPPA-reconstructed observations $D_{na}$, the likelihood of $D_{na}$ given the full k-space Y is $$p(D_{na}|Y)=CN(vec(D_{na});vec(K_{na}Y),\Lambda_G) \tag{4}$$

where the amplified noise has covariance $\Lambda_G$.

Putting these signal and observation models together, the minimum mean squared error estimator is the posterior mean $E\{Y|D_a,D_{na}\}$. Due to variable mixing in both the signal and observation models, this estimator does not have a closed form, and numeric integration methods like quadrature integration are computationally infeasible (due to dimensionality). A stochastic method (e.g. importance sampling) may be used, but convergence may be slow due to the number of correlated variables involved. Instead, system 10 finds the maximum a posteriori (MAP) estimate using a compressed sensing-like optimization problem:

$$Y = \underset{Y}{\operatorname{minimize}} \frac{1}{2} \|vec(K_aY - D_a)\|_{I_{M\times M}\otimes\Lambda}^2 + \tag{5}$$

$$\frac{1}{2}\|vec(K_{na}Y - D_{na})\|_{\Lambda_G}^2 + \lambda\|\Psi F^{-1}Y\|_{1,2}.$$

The notation $\|x\|_\Lambda$ is shorthand for $\|\Lambda^{-1/2}x\|_2$ (for Hermitian symmetric positive definite $\Lambda$). This estimator may be solved using different methods, including iteratively reweighted least squares (IRLS). This formulation denoises the acquired and GRAPPA reconstructed k-space.

Assuming the GRAPPA kernel G is an unknown variable, instead of being computed from the ACS lines. From the matrices of source points $Y_s$ and target points $Y_t$ from the ACS lines, with observations $D_s$ and $D_t$, observations of the form $GD_s = Y_t +$ noise are added. Further, assuming that the source points follow the same observation model as the other acquired data, the noise is complex Gaussian and amplified by the GRAPPA kernel (call the noise covariance $\Lambda_{ACS}$). The optimization problem now becomes joint over the full k-space Y and the GRAPPA kernel G:

$$\{Y, G\} = \underset{Y,G}{\text{minimize}} \frac{1}{2} \|vec(Y_t - GD_s)\|^2_{\Lambda_{ACS}} + \quad (6)$$
$$\frac{1}{2}\|vec(K_{na}Y - GRAPPA(G, D_a))\|^2_{\Lambda_G} +$$
$$\frac{1}{2}\|vec(K_a Y - D_a)\|^2_{I_{M \times M} \otimes \Lambda} + \lambda \|\Psi F^{-1} Y\|_{1,2}.$$

The covariance matrices $\Lambda_G$ and $\Lambda_{ACS}$ depend on G, so the first two parts of the objective are not strictly least-squares terms, and the overall problem is not convex. These covariance matrices are fixed and IRLS is applied to form an iterative method and to update the covariance matrices concurrently with of the diagonal IRLS re-weighting matrix $\Delta$.

$$\{Y, G\} = \underset{Y,G}{\text{minimize}} \frac{1}{2}\|vec(Y_t - GD_s)\|^2_{\Lambda_{ACS}} + \quad (7)$$
$$\frac{1}{2}\|vec(K_{na}Y - GRAPPA(G, D_a))\|^2_{\Lambda_G} +$$
$$\frac{1}{2}\|vec(K_a Y - D_a)\|^2_{I_{M \times M} \otimes \Lambda} + \frac{\lambda}{2}\|\Delta^{1/2}\Psi F^{-1} Y\|^2_F,$$

where $\Delta_{n,n} = 1/\|W_1[n], \ldots, W_p[n], \epsilon\|_2$, with $W = \Psi F^{-1} Y$ from a previous iteration, and small $\epsilon > 0$.

Since Equation 6 is not convex, convergence to a global minimum is not guaranteed, and initialization affects a solution. The initial full k-space is zero-filled, containing the acquired data, and the initial GRAPPA kernel is the least-squares or minimum energy solution to the system of ACS fit equations ($G = D_t D_s^\dagger$, where $D_s^\dagger$ is the left or right pseudo-inverse of $D_s$). Convergence occurs when the objective decreases by less than a predetermined percentage. While this criterion is susceptible to the possibility that updating $\Lambda_{ACS}$ and $\Lambda_G$ can increase the objective, such behavior does not hamper simulations. Although the covariance matrices have nonzero cross terms, because the GRAPPA kernel introduces correlations among k-space frequencies, noise amplification of GRAPPA is addressed by using a block diagonal matrix with correlations limited to being across channels (blocks are P×P).

The system employs a method involving measuring noise covariance matrix $\Lambda$ by estimating covariance across coil channels of data from noise-only (no RF excitation) pre-scan acquisition. The measurements are stored in an electronic storage device. A computational device (imaging computer 17, such as a computer, laptop, DSP, smartphone, tablet, for example) is used to electronically receive undersampled data from parallel RF receiver coil array 4. The computational device extracts a block of k-space data for calibration (the ACS lines), constructs fit equations from ACS lines and collects data into matrices $D_s$ and $D_t$. The computational device initializes the GRAPPA kernel to $G = D_t D_s^\dagger$, where $D_s^\dagger$ is the right pseudo-inverse $D_s^H(D_s D_s^H)^{-1}$ or the left pseudo-inverse $(D_s^H D_s)^{-1} D_s^H$ for the overdetermined and underdetermined cases, respectively. The computational device further initializes the GRAPPA noise covariances $\Lambda_G$ and $\Lambda_{ACS}$ based on the initial value of G and initializes k-space by zero-filling (Y is limited to contain the acquired data D, including the ACS lines). The computational device adaptively selects a sparsifying transform $\Psi$ (e.g., the four-level '9-7' discrete wavelet transform) and a tuning parameter value $\lambda$ in response to the type of acquired data and procedure being performed and iterates until convergence. The device computes re-weighting matrix $\Delta$ for the $l_{1,2}$ term using the current estimate of Y, updates G and Y using an iterative solver such as LSMR for Equation 7 and updates $\Lambda_G$ and $\Lambda_{ACS}$ based on a new value of G.

If the computational device determines the objective in Equation 6 decreases by less than a predetermined percentage, the method has converged and the device recovers the coil images from k-space Y using the inverse discrete Fourier transform. The computational device combines the reconstructed coil images into a single image using sum-of-squares (magnitude only) or a linear combination of the coils (magnitude and phase) and outputs a combined image to a display or an electronic storage device.

Figure 2C:
FIG. 2B shows its corresponding k-space and FIG. 2C shows its sparse transform using a four-level '9-7' 2D (two dimensional) DWT (Discrete Wavelet transform) representation, according to invention principles.
Figure 2A:
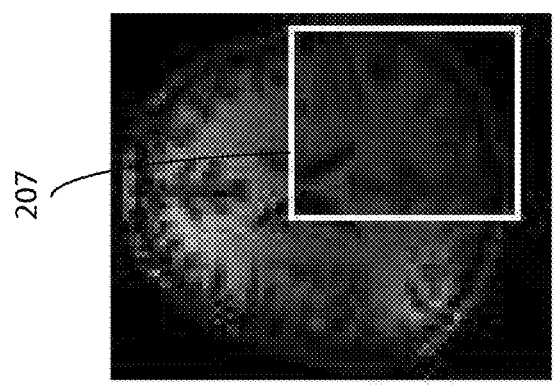
FIG. 2A shows an extracted, cropped, and normalized axial slice combined magnitude reference image.
Figure 2B:
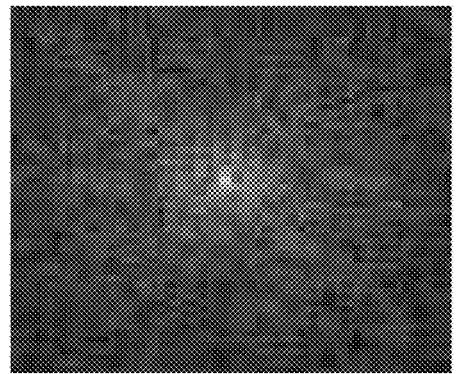

FIG. 2A shows an extracted, cropped, and normalized axial slice $T_1$-weighted image combined magnitude reference image, FIG. 2B shows its corresponding k-space and FIG. 2C shows its sparse transform using a four-level '9-7' 2D (two dimensional) DWT (Discrete Wavelet transform) representation. The FIG. 2A image is a $T_1$-weighted full-FOV image (256×256×176 mm FOV; 1.0 mm isotropic resolution) acquired on a Siemens 3T (Tesla) scanner using a Siemens 32-channel receive array head coil. The k-space is undersampled in both directions in the axial plane. A 36×36 ACS block is retained in the center of k-space, and full-FOV images are reconstructed using GRAPPA and system 10. The channel noise covariance matrix $\Lambda$ is measured from a separate noise (no RF excitation) acquisition. A reconstructed full k-space is combined to form a single combined magnitude image using the SNR-optimal coil combination based on sensitivities estimated from apodized ACS lines and $\Lambda$. The magnitude images are compared using difference images and peak-signal-to-noise ratio (PSNR). Although PSNR, as a non-specific measure, does not accurately reflect image quality as perceived by a clinician, it facilitates study of quantitative trends in image quality. A convergence threshold of 1% is used.

Figure 3B:
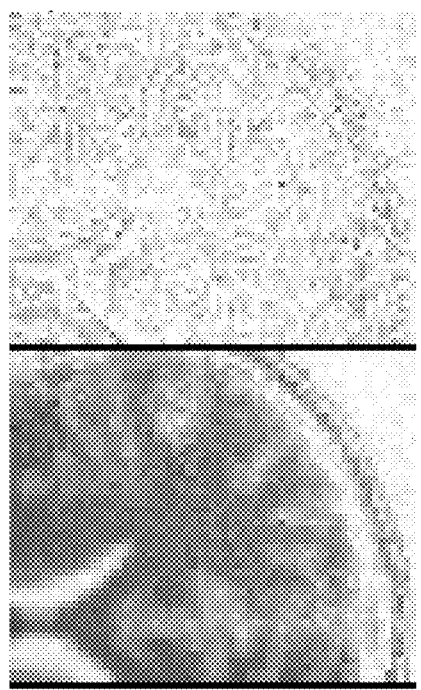
FIG. 3A shows a GRAPPA reconstruction image and corresponding difference image and FIG. 3B shows a system reconstruction image and corresponding difference image, according to invention principles.
Figure 3A:
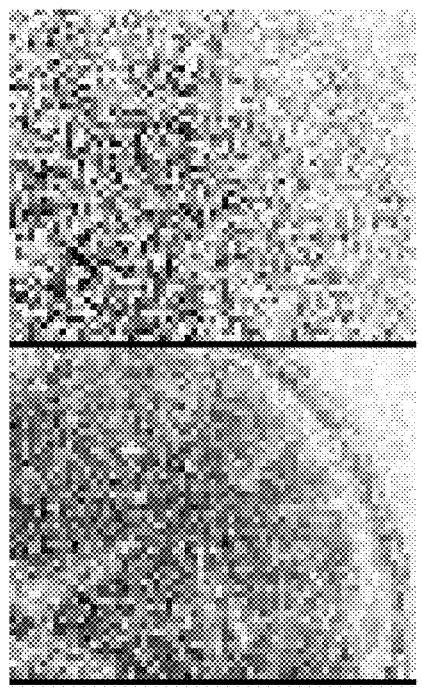

FIG. 3A shows a GRAPPA reconstruction image and corresponding difference image and FIG. 3B shows a system reconstruction image and corresponding difference image. The FIG. 3A and FIG. 3B images and associated difference images indicate that while the GRAPPA reconstruction is noisy, the Bayesian joint estimated system 10 image has substantially less noise. In acquiring the FIG. 3 images, the $T_1$-weighted k-space shown in FIG. 2B is undersampled by a factor of 5 along the coronal axis (vertical direction) and a factor of 4 along the sagittal axis (horizontal direction), and a 36×36 block of ACS data is retained, for acceleration of R=12.1. For both the GRAPPA and Bayesian joint estimation methods, a GRAPPA kernel for 5×4 source points is calibrated for each of the target points. In the case of un-regularized GRAPPA kernel calibration, the calibrated kernel yields a GRAPPA-reconstructed image with significant noise amplification in about 1 second. The Bayesian joint estimation of the kernel and full k-space produces a reconstruction in under 80 minutes (4 IRLS steps with a total of 555 inner iterations of the least-squares LSMR solver)

with far less noise than before while retaining important structural information. Inset regions 207 (FIG. 2A) (right-posterior quadrant) of the reconstructed images alongside corresponding inset regions of the difference images for both methods in FIG. 3 portray the difference in image quality occurring when comparing the GRAPPA and system 10 Bayesian joint estimation methods.

Figures 4A, 4B:
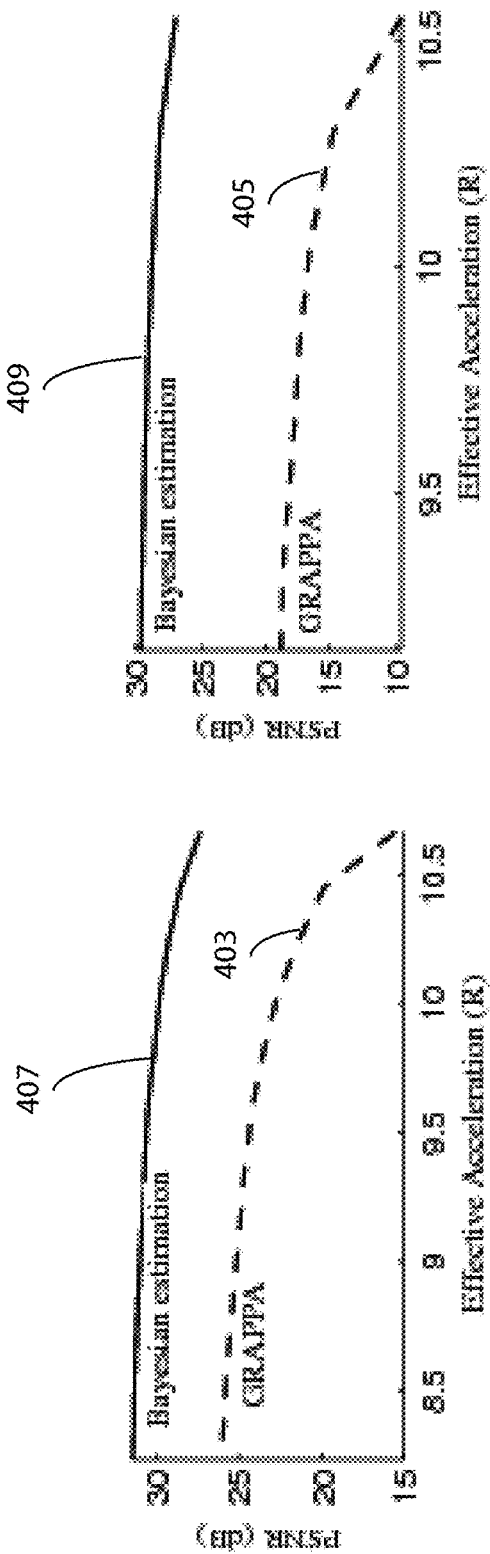
FIG. 4A shows a graph of PSNR (Peak Signal to Noise Ratio) against acceleration factor for a GRAPPA reconstruction and FIG. 4B shows a graph of PSNR (Peak Signal to Noise Ratio) against acceleration factor for a system reconstruction, according to invention principles.

FIG. 4A shows a graph of PSNR (Peak Signal to Noise Ratio) against acceleration factor for a GRAPPA reconstruction 403 and system 10 Bayesian reconstruction 407 for 4×4 nominally undersampled data. FIG. 4B shows a graph of PSNR (Peak Signal to Noise Ratio) against acceleration factor for a GRAPPA reconstruction 405 and system 10 Bayesian reconstruction 409 for 5×4 nominally undersampled data. FIG. 4 indicates that as the number of ACS lines is varied changing the acceleration, the Bayesian estimation method consistently outperforms the GRAPPA reconstruction in terms of PSNR. The curves of FIGS. 4A and 4B are derived for the same image for both 4×4 (FIG. 4A) and 5×4 (FIG. 4B) nominal undersampling, changing the effective acceleration by varying the number of ACS lines. FIGS. 4A, 4B compare the magnitude image PSNRs for both GRAPPA and Bayesian joint estimation reconstructions. The curves indicate that as the effective acceleration increases due to having fewer ACS lines, the Bayesian joint estimation method consistently produces substantially higher quality images (as measured by PSNR). The ACS block grows from 35×35 to 48×48 for the 4×4 nominally undersampled data, and from 42×42 to 48×48 for the 5×4 undersampled data. For fewer ACS lines, the number of fit equations from the ACS lines is insufficient to perform a least-squares fit for the GRAPPA kernel calibration.

The substantial improvement in image quality achieved by the system 10 Bayesian joint estimation method is shown in FIGS. 4A, 4B and yields 5-10 dB improvement over GRAPPA. In considering the number of ACS lines needed for a given nominal undersampling factor to achieve a minimum PSNR, the system 10 Bayesian estimation method achieves that PSNR with substantially fewer ACS lines. The system 10 method enables greater acceleration of MRI using a Bayesian probabilistic model of the full MR image k-space data set and of the GRAPPA kernel weights to form together, estimates of both the full MR image data and the kernel weights that promote sparsity in a resulting composite MR image. The method takes into account acquired k-space data, conventionally calibrated GRAPPA kernel weights, and a non-uniform noise model imposed on k-space data by GRAPPA kernel weights. The system advantageously reduces noise amplification due to using a conventional accelerated parallel imaging reconstruction method like GRAPPA. The system improves image quality for acquired highly undersampled data enabling faster parallel image acquisition, reducing cost and increasing capabilities of MRI.

Figure 5:
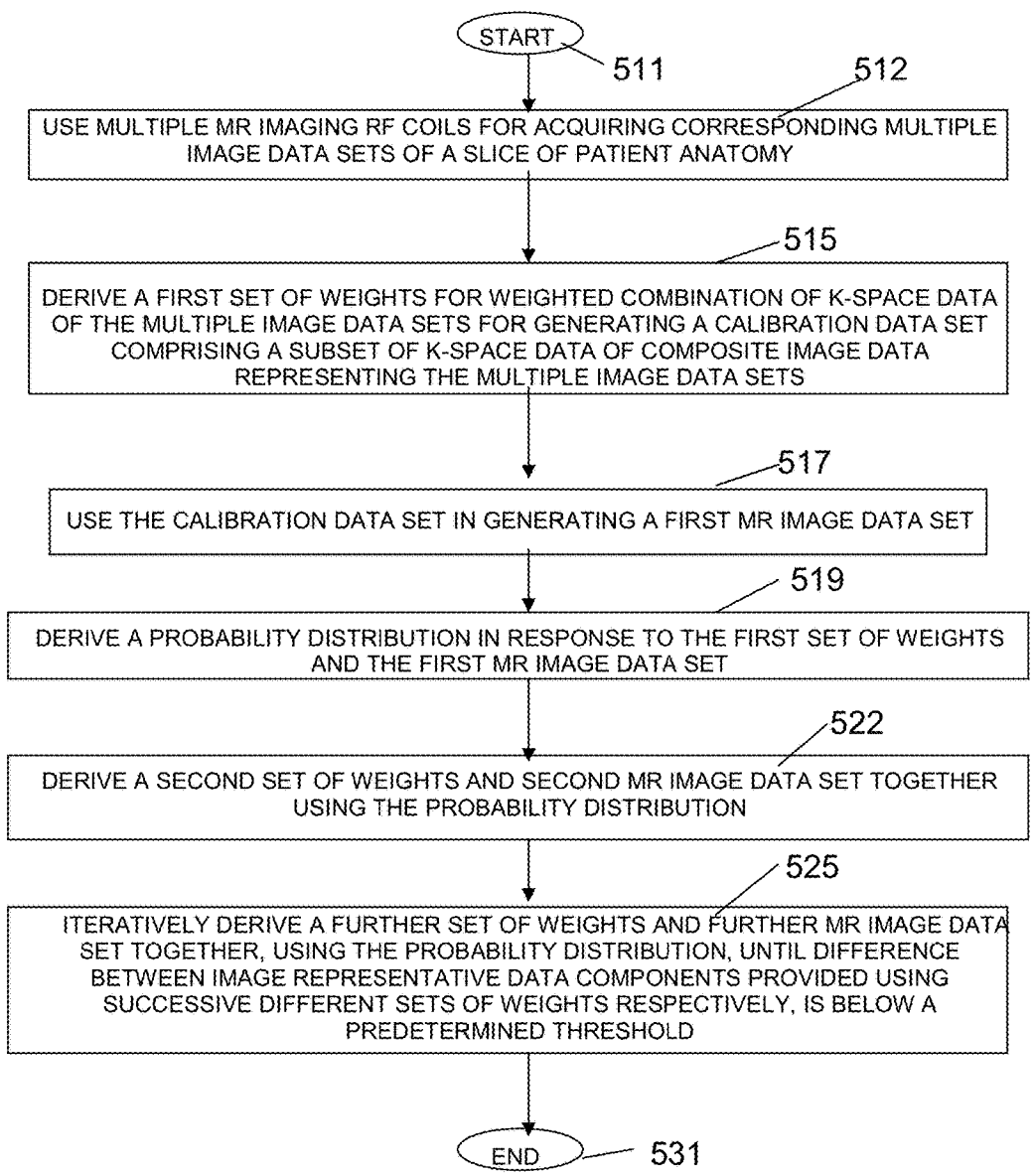
FIG. 5 shows a flowchart of a process performed by a system for parallel image processing in MR imaging, according to invention principles.

FIG. 5 shows a flowchart of a process performed by system 10 (FIG. 1) for parallel image processing in MR imaging. In step 512 following the start at step 511, system 10 uses multiple RF coils 4 for acquiring corresponding multiple image data sets of a slice of patient anatomy by using a parallel imaging method compatible with at least one of (a) SMASH (SiMultaneous Acquisition of SpatialHarmonics) and (b) GRAPPA (Gene-Ralized Autocalibrating Partially Parallel Acquisition). In one embodiment, the multiple image data sets of the slice individually comprise a reduced size block of calibration k-space data. In step 515 an image data processor in imaging computer 17, derives a first set of weights for weighted combination of k-space data of the multiple incomplete image data sets for generating a calibration data set comprising a subset of k-space data of composite image data representing the multiple image data sets. The image data processor in step 517 uses the calibration data set in performing an image reconstruction by generating a first substantially complete MR image data set. The image data processor generates the first MR image data representing a single image set by deriving the first set of weights using the multiple image data sets of the slice by performing a weighted combination of luminance representative data of individual corresponding pixels of the multiple image data sets in providing an individual pixel luminance value of the first MR image data set.

In step 519, the image data processor derives a probability distribution in response to the first set of weights and the first MR image data set and in step 522 derives a second set of weights and second substantially complete MR image data set together using the probability distribution. The second MR image data set has a reduced set of data components comprising a data set of increased sparsity relative to the first MR image data set. Further, the reduced set of components comprises components in a predetermined transform domain representation of data representing a composite image. The probability distribution in one embodiment comprises a Gaussian distribution. The image data processor in step 525 iteratively derive a further set of weights and further MR image data set together, using the probability distribution, until difference between image representative data components provided using successive different sets of weights respectively, is below a predetermined threshold.

The image data processor uses the weights to interpolate image representative data components and derives the second set of weights so that a difference between interpolated image representative data components provided using the first and second set of weights respectively, is below a predetermined threshold. Specifically, the image data processor uses weights to interpolate missing components in an acquired undersampled k-space data set from a linear combination of k-space data points for image data from an individual RF coil. The image data processor uses the weights to provide a weighted linear combination of luminance representative data of individual corresponding pixels of the multiple image data sets. The process of FIG. 5 terminates at step 531.

Returning to FIG. 1, RF coils 4 emit RF pulses to excite nuclear proton spins in a patient on support table 5 in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Imaging computer 17 reconstructs an image from the processed acquired RF echo pulse data. The processing of RF data, the image data and the control programs is performed under control of system computer 20. In response to predetermined pulse sequence control programs, sequence controller 18 controls generation of desired pulse sequences and corresponding scanning of k-space. In particular, sequence controller 18 controls the switching of the magnetic gradients at appropriate times, transmission of RF pulses with a determined phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens.

RF pulse signals are applied to RF coils 4, which in response produces magnetic field pulses which rotate the spins of the protons in the imaged body by ninety degrees or by one hundred and eighty degrees for so-called "spin echo" imaging, or by angles less than or equal to 90 degrees for so-called "gradient echo" imaging. In response to the applied RF pulse signals, RF coils 4 receive MR signals, i.e., signals from the excited protons within the body as they return to an equilibrium position established by the static and gradient magnetic fields. The MR signals comprising nuclear spin echo signals received by RF coils 4 as an alternating field resulting from the precessing nuclear spins, are converted into a voltage that is supplied via a radio-frequency amplifier 7 and multiplexer 6 to a radio-frequency receiver processing unit 8 of a radio-frequency system 22.

The radio-frequency system 22 operates in an RF signal transmission mode to excite protons and in a receiving mode to process resulting RF echo signals. In transmission mode, system 22 transmits RF pulses via transmission channel 9 to initiate nuclear magnetic resonance in volume M. Specifically, system 22 processes respective RF echo pulses associated with a pulse sequence used by system computer 20 in conjunction with sequence controller 18 to provide a digitally represented numerical sequence of complex numbers. This numerical sequence is supplied as real and imaginary parts via digital-analog converter 12 in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume M. The conversion from transmitting to receiving operation is done via a multiplexer 6. RF coils 4 emit RF pulses to excite nuclear proton spins in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Transverse plane inversion occurs in the x or y direction and longitudinal plane inversion occurs in the z plane.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and is conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

DEFINITIONS

Incomplete as used herein in the term "incomplete image data set" or "incomplete MR image dataset", for example, comprises less than the whole of a k-space dataset.

Complete as used herein in the term "complete image data set" or "complete MR image dataset", for example, comprises sufficient k-space or other data usable to generate a clinically adequate MR image data set.

EPI comprises Echo planar imaging involves image acquisition whereby a complete image is formed from a single data sample (k-space lines are acquired in one repetition time) of a gradient echo or spin echo sequence.

An inversion recovery (IR) pulse inverts longitudinal magnetization from the positive z-axis by 180 degrees to the negative z-axis. IR pulses are used as preparation pulses prior to a main imaging pulse sequence to achieve different kinds of MR contrast (such as T1 weighted, T2 weighted).

iPAT (integrated Parallel Acquisition Techniques) comprises "parallel imaging". It enables faster scanning through reduced phase encoding and addition of RF coil information. An iPAT factor of 2 enables scanning about twice as fast, iPAT factor of 3 enables scanning about three times as fast and so on.

TI comprises inversion time, the time between an inversion recovery pulse and the next RF excitation pulse. TI determines the image luminance contrast.

$T_1$ comprises the longitudinal (or spin-lattice) relaxation time $T_1$ decay constant.

$T_2$ comprises the transverse (or spin-spin) relaxation time $T_2$ is the decay constant for a proton spin component.

TR comprises repetition time, the time between successive RF excitation pulses.

TE (Echo Time) comprises a time period between the start of an RF pulse and the maximum in the received echo signal. The sequence is repeated every TR seconds.

B0 is the main static base MRI magnetic field.

B1 is the RF transmit coil field.

The system and processes of the FIGS. 1-5 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The system employs a Bayesian estimation method for jointly calibrating a GRAPPA reconstruction kernel and reconstructing full k-space from undersampled parallel MRI data from parallel RF coil image data to improve GRAPPA reconstruction at high levels of undersampling. Further, the processes and applications may, in alternative embodiments, be located on one or more (e.g., distributed) processing devices on a network linking the units of FIG. 1. Any of the functions and steps provided in FIGS. 1-5 may be implemented in hardware, software or a combination of both. No claim element herein is to be construed under the provisions of 35 U.S.C. 112, sixth paragraph, unless the element is expressly recited using the phrase "means for."

What is claimed is:

1. A system for parallel image processing in MR imaging, comprising:
   a plurality of MR imaging RF coils, wherein each MR imaging RF coil is configured to individually receive MR imaging signals representing a slice or volume of patient anatomy;
   an MR imaging arrangement configured to use the plurality of RF coils to acquire a corresponding plurality of incomplete image data sets of said slice or volume; and
   an image data processor comprising at least one processing device, wherein the image data processor is configured to:
      derive a first set of weights for calculating a weighted combination of k-space data of said plurality of incomplete image data sets to generate a calibration data set comprising a subset of k-space data of composite image data representing said plurality of image data sets,
      generate a first complete MR image data set based on said calibration data set,
      determine parameters of a probability distribution based on said first set of weights and said first complete MR image data set,
      derive a second set of weights based on said calibration data set and on said first complete MR image data set, using said probability distribution, and
      generate a second complete MR image data set based on said second set of weights.

2. A system according to claim 1, wherein said image data processor is configured to derive said second set of weights and said second complete MR image data set using a sparsifying transform and said probability distribution to represent an image with a reduced set of data components relative to said first complete MR image data set.

3. A system according to claim 1, wherein said image data processor derives the first complete MR image data set based on application of a probabilistic model.

4. A system according to claim 1, wherein said image data processor is configured to derive a third set of weights and a third complete MR image data set using said probability distribution.

5. A system according to claim 1, wherein said image data processor is configured to iteratively derive at least one further set of weights and at least one further complete MR image data set based on said calibration data set and on said first complete MR image data set, using said probability distribution, until a difference between corresponding image representative data components that are determined based on successive different sets of weights is below a predetermined threshold.

6. A system according to claim 1, wherein said image data processor generates said first complete MR image data set representing a single image using said first set of weights by performing a weighted combination of luminance representative data of individual corresponding pixels of said plurality of incomplete image data sets in providing an individual pixel luminance value of said first MR image data set.

7. A system according to claim 1, wherein said probability distribution comprises a Gaussian distribution combined with a sparsity-promoting distribution.

8. A system according to claim 1, wherein said image data processor generates said first MR image data set by deriving said first set of weights using said plurality of incomplete image data sets of said slice.

9. A system according to claim 1, wherein each of said plurality of incomplete image data sets of said slice comprises a reduced size block of calibration k-space data.

10. A system according to claim 1, wherein said image data processor uses said first set of weights to interpolate missing components in an acquired undersampled k-space data set from a linear combination of k-space data points for image data based on signals received by from an individual RF coil.

11. A system according to claim 1, wherein said second MR image data set includes a reduced set of significant data components comprising a data set of increased sparsity relative to said first MR image data set.

12. A system according to claim 11, wherein said reduced set of significant components comprise components in a predetermined transform domain representation of data representing a composite image.

13. A system according to claim 1, wherein said image data processor uses said first set of weights to interpolate image representative data components and derives said second set of weights, such that a difference between interpolated image representative data components provided using said first and second set of weights respectively, is below a predetermined threshold.

14. A system according to claim 1, wherein said image data processor uses said first set of weights to provide a weighted linear combination of luminance representative data of individual corresponding pixels of said plurality of incomplete image data sets.

15. A system according to claim 1, wherein said generation of a complete MR image data set comprises performing an image reconstruction.

16. A system according to claim 1, wherein said MR imaging system is further configured to use the plurality of RF coils to acquire a corresponding plurality of image data sets of said slice or volume by using a parallel imaging method compatible with at least one of (a) SMASH (SiMultaneous Acquisition of SpatialHarmonics) and (b) GRAPPA (Gene-Ralized Autocalibrating Partially Parallel Acquisition).

17. In an MR imaging system, a method for parallel image processing comprising the steps of:
using a plurality of MR imaging RF coils to acquire a corresponding plurality of incomplete image data sets of a slice or volume of patient anatomy;
deriving a first set of weights for weighted combination of k-space data of said plurality of incomplete image data sets to generate a calibration data set comprising a subset of k-space data of composite image data representing said plurality of incomplete image data sets;
using said calibration data set to generate a first complete MR image data set;
determining parameters of a probability distribution based on said first set of weights and said first complete MR image data set;
deriving a second set of weights based on said calibration data set and on said first complete MR image data set, using said probability distribution, and
generating a second complete MR image data set based on said second set of weights.

18. A method according to claim 17, wherein:
generating said second complete MR image data set comprises using a sparsifying transform and said probability distribution to represent an image with a reduced set of significant data components relative to said first complete MR image data set.

19. A method according to claim 17, further comprising the step of:
deriving said first MR image data set based on application of a probabilistic model.

20. A method according to claim 17, further comprising the step of:
deriving a third set of weights and a third substantially complete MR image data set using said probability distribution.

21. A method according to claim 17, further comprising the step of:
iteratively deriving at least one further set of weights and at least one further complete MR image data set together, using said probability distribution, until a difference between image representative data components provided using successive different sets of weights respectively is below a predetermined threshold.

* * * * *